United States Patent [19]

Tadros

[11] Patent Number: 5,151,340
[45] Date of Patent: Sep. 29, 1992

[54] SELECTED PHOTOACTIVE METHYLOLATED CYCLOHEXANOL COMPOUNDS AND THEIR USE IN RADIATION-SENSITIVE MIXTURES

[75] Inventor: Sobhy Tadros, Seekonk, Mass.

[73] Assignee: OCG Microelectronic Materials, Inc., Cheshire, Conn.

[21] Appl. No.: 546,988

[22] Filed: Jul. 2, 1990

[51] Int. Cl.$^5$ .................. G03F 7/022; G03F 7/023; G03F 7/32; C07C 245/00
[52] U.S. Cl. .................. 430/192; 430/165; 430/193; 430/326; 534/556; 534/557
[58] Field of Search .............. 430/165, 192, 193; 534/556, 557, 326

[56] References Cited

U.S. PATENT DOCUMENTS

| | | | |
|---|---|---|---|
| 2,767,092 | 10/1956 | Schmidt | 430/192 |
| 3,753,715 | 8/1973 | Klüpfel et al. | 430/281 |
| 3,823,130 | 7/1974 | Deutsch et al. | 430/193 |
| 3,920,455 | 11/1975 | Deutsch et al. | 430/193 |
| 4,628,020 | 12/1986 | Stahlhofen | 430/193 |
| 4,732,837 | 3/1988 | Patvin et al. | 430/193 |
| 4,859,563 | 8/1989 | Miura et al. | 430/193 |
| 5,002,851 | 3/1991 | Toukhy | 430/192 |
| 5,019,479 | 5/1991 | Oka et al. | 430/193 |

OTHER PUBLICATIONS

Organic Synthesis, vol. 4, p. 907.

Primary Examiner—Charles L. Bowers, Jr.
Assistant Examiner—John S. Y. Chu

[57] ABSTRACT

A photoactive compound having formula (I):

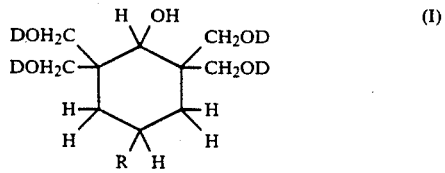

wherein R is selected from the group consisting of hydrogen or a lower alkyl group having 1-4 carbon atoms and each D is individually selected from the group consisting of a hydrogen or photoactive o-quinonediazide sulfonyl group; subject to the proviso that at least two of the four D's in formula (I) are photoactive o-naphthoquinonediazide sulfonyl moieties.

13 Claims, No Drawings

SELECTED PHOTOACTIVE METHYLOLATED CYCLOHEXANOL COMPOUNDS AND THEIR USE IN RADIATION-SENSITIVE MIXTURES

BACKGROUND OF THE INVENTION

1. Field of the Invention

The present invention relates to photoactive compounds formed by the esterification of selected methylolated cyclohexanol compounds with sulfonyl halides of o-naphthoquinone diazides. Further, the present invention also relates to radiation-sensitive mixtures (e.g., those particularly useful as positive-working or negative-working photoresists) containing the combination of these photoactive compounds with alkali-soluble binder resins dissolved in a solvent. And furthermore, the present invention also relates to substrates coated with these radiation-sensitive mixtures, as well as the process of coating, imaging, and developing these radiation-sensitive mixtures on these substrates.

2. Description of Related Art

Photoresist compositions are used in microlithographic processes for making miniaturized electronic components such as in the fabrication of integrated circuits and printed wiring board circuitry. In these processes, a thin coating or film of a photoresist composition is generally first applied to a substrate material, such as silicon wafers used for making integrated circuits or aluminum or copper plates of printed wiring boards. The coated substrate is then baked to evaporate any solvent in the photoresist composition and to fix the coating onto the substrate. The baked coated surface of the substrate is next subjected to an image-wise exposure of radiation. This radiation exposure causes a chemical transformation in the exposed areas of the coated surface. Visible light, ultraviolet (UV) light, electron beam, ion beam and X-ray radiant energy are radiation types commonly used today in microlithographic processes.

After this image-wise exposure, the coated substrate is treated with a developer solution to dissolve and remove either the radiation-exposed or the unexposed areas of the coated surface of the substrate. In some processes, it is desirable to bake the imaged resist coating before this developing step. This intermediate step is sometimes called Post-exposure bake or PEB.

There are two types of photoresist compositions - - - negative-working and positive-working. When negative-working photoresist compositions are exposed image-wise to radiation, the areas of the resist composition exposed to the radiation become less soluble to a developer solution (e.g. a crosslinking reaction occurs) while the unexposed areas of the photoresist coating remain relatively soluble to a developing solution. Thus, treatment of an exposed negative-working resist with a developer solution causes removal of the non-exposed areas of the resist coating and the creation of a negative image in the photoresist coating, and thereby uncovering a desired portion of the underlying substrate surface on which the photoresist composition was deposited. On the other hand, when positive-working photoresist compositions are exposed image-wise to radiation, those areas of the resist composition exposed to the radiation become more soluble to the developer solution (e.g. the Wolff rearrangement reaction with the photoactive compound occurs) while those areas not exposed remain relatively insoluble to the developer solution. Thus, treatment of an exposed positive-working resist with the developer solution causes removal of the exposed areas of the resist coating and the creation of a positive image in the photoresist coating. Again, a desired portion of the underlying substrate surface is uncovered.

Positive-working photoresist compositions are currently favored over negative-working resists because the former generally have better resolution capabilities and Pattern transfer characteristics.

After this development operation, the now partially unprotected substrate may be treated with a substrate-etchant solution or plasma gases and the like. This etchant solution or Plasma gases etch the portion of the substrate where the photoresist coating was removed during development. The areas of the substrate are protected where the photoresist coating still remains and, thus, an etched pattern is created in the substrate material which corresponds to the photomask used for the image-wise exposure of the radiation. Later, the remaining areas of the photoresist coating may be removed during a stripping operation, leaving a clean etched substrate surface. In some instances, it is desirable to heat treat the remaining resist layer after the development step and before the etching step to increase its adhesion to the underlying substrate and its resistance to etching solutions.

End users of photoresists are demanding photoresist formulations which possess better lithographic properties for the fabrication of smaller microelectronic circuits. The lithographic properties which are critical to these end-users include the following: (1) good resolution capabilities in both the micron and submicron ranges without incomplete development in the areas to be image-wise removed (i.e. scumming); (2) higher thermal image deformation temperatures (e.g. above 120° C.); (3) relatively fast photospeeds; (4) good adhesion to substrate; (5) good developer dissolution rates; (6) good process latitude; (7) near to absolute vertical profiles (or good contrast) between exposed and unexposed photoresist areas after development; (8) good resistance to etching solutions and Plasma etching techniques; (9) reduced tendency to form insoluble particulates and (10) mask linearity.

Generally, in the past efforts to improve one of these lithographic properties have caused significant decreases in one or more of the other lithographic properties of the photoresist. Accordingly, there is a need for improved photoresist formulations which possess all of these desired properties. The present invention is believed to be an answer to that need.

BRIEF SUMMARY OF THE INVENTION

Accordingly, the present invention is directed to Photoactive o-naphthoquinone diazide sulfonyl moieties of methylolated cyclohexanol compounds having formula (I):

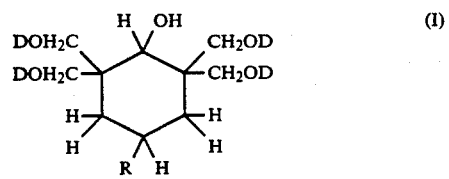

wherein R is selected from the group consisting of hydrogen or a lower alkyl group having 1-4 carbon atoms and each D is individually selected from an o-naphthoquinone diazide sulfonyl moiety or a hydrogen atom, with the proviso at least two D's are o-naphthoquinone diazide sulfonyl moieties.

Moreover, the present invention is directed to a radiation sensitive mixture useful as a positive photoresist comprising an admixture of at least one photoactive o-naphthoquinone diazide compound of formula (I) above and an alkali-soluble binder resin; the amount of said photoactive o-naphthoquinone diazide compound or compounds being about 5% to about 40% by weight and the amount of said binder resin being about 60% to 95% by weight, based on the total solids content of said radiation sensitive mixture.

Still further, the present invention also encompasses the process of coating substrates with these radiation sensitive mixtures and then exposing and developing these coated substrates.

Also further, the present invention encompasses said coated substrates (both before and after imaging) as novel articles of manufacture.

DETAILED DESCRIPTION

The methylolated cyclohexanol precursors to the photoactive compounds of the present invention may be made by reacting either cyclohexanone or a 4-lower alkyl-substituted cyclohexanone with formaldehyde. The molar ratio of the two reactants should be at least 1:4 in order to form the four methylolated groups on the resulting product. This reaction is illustrated by reacting one mole of cyclohexanone with 5 moles of formaldehyde and 1 mole of water as shown in the following reaction equation (A):

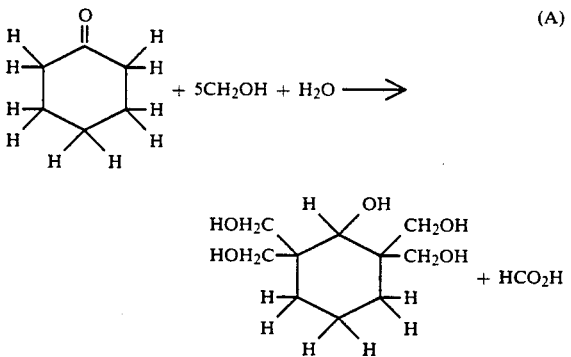

Generally, this precursor-formation reaction is carried out by reacting the cyclohexanone compound with formaldehyde in a mole ratio of from about 1:4 to 1:10, preferably 1:5 to 1:8. The preferred reaction temperature is from about 15°-50° C. The preferred reaction time is from about 15-120 minutes. The reaction is preferably carried out at atmospheric pressure in the presence of a solvent. The preferred solvent is water. This reaction preferably occurs in an alkaline pH of greater than 7. Also preferably, the reaction may be catalyzed by the addition of moderate alkaline compounds (e.g., CaO and the like). The intended product may be recovered from the reaction mixture by mixing the reaction mixture with acidified water and thus Precipitating the product in solid form. A similar synthesis of a cyclohexanone/formaldehyde adduct may be found in Organic Synthesis, Vol. 4, page 907.

These methylolated cyclohexanol compounds may be converted into the photoactive compounds (PACs) of formula I by their condensation with o-naphthoquinone diazide sulfonyl compounds. Any o-naphthoquinone diazide sulfonyl compound used in making photoresist sensitizers may be employed herein. The most preferred o-naphthoquinone diazide sulfonyl ester moieties are derived from 3-diazo-3,4-dihydro-4-oxo-naphthalene-1-sulfonic acid chloride (also known as 1,2-naphthoquinonediazo-4-sulfonic acid chloride or Diazo M). This 4-ester group or moiety has the following chemical formula (II):

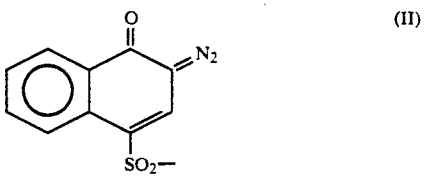

It is understood that present invention covers the use of o-naphthoquinone diazide sulfonyl moieties singly or in mixtures in the condensation reaction with one or more methylolated cyclohexanol precursors. Also, the present invention encompasses separate reactions of a methylolated cyclohexanol precursor with different o-naphthoquinone diazide sulfonyl moieties followed by blending those reaction products together.

This condensation reaction may be carried under any conventional diazide ester condensation conditions. Preferably, the sulfonic acid halide precursor, most preferably the sulfonic acid chloride precursor of the compound of formula II, is dissolved in a suitable solvent. Suitable solvents include acetone, dioxane, gamma-butyrolactone, methylene chloride, pyridine, tetrahydrofurfural alcohol and the like. The cyclohexanol precursor is then added to this solution. It is advantageous to carry out this reaction in the presence of an acid-scavenging base, such as alkali metal carbonates or bicarbonates, alkaline earth metal carbonates or bicarbonates, tertiary aliphatic amines or Pyridine or pyridine derivatives.

The esterification products of this reaction may be recovered from the reaction mixture by any conventional means, preferably by precipitation into acidified water, followed by filtration and drying.

The preferred photoactive compounds (sometimes known as "sensitizers") are those made from the preferred methylolated cyclohexanol precursors; namely, with 2,2,6,6-tetramethylol cyclohexanol or 2,2,6,6-tetramethylol-4-methyl-cyclohexanol.

When making these photoactive compounds, the quinone diazide sulfonyl group is most preferably 3-diazo-3,4-dihydro-4-oxo-naphthalene-1-sulfonyl with the proviso that at least three of the D's in formula (I) are said sulfonyl moieties.

At least one of the ester compounds of formula (I) may be mixed with an alkali-soluble resin or resins to make radiation sensitive mixtures which are useful as positive-working photoresist compositions. The term "alkali-soluble resin" is used herein to mean a resin which will dissolve completely in an aqueous alkaline developing solution conventionally used with positive-working photoresist compositions. Suitable alkali-soluble resins include phenol-formaldehyde novolak resins, cresol-formaldehyde novolak resins, and polyvinyl phenol resins, preferably having a molecular weight of about 500 to about 40,000, and more preferably from about 800 to 20,000. These novolak resins are preferably prepared by the condensation reaction of phenol or cresols with formaldehyde and are characterized by being light-stable, water-insoluble, alkali-soluble and film-forming. The most preferred class of novolak resins is formed by the condensation reaction between a mixture of meta- and para-cresols with formaldehyde having a molecular weight of about 1,000 to about 10,000. The preparation of examples of such suitable resins is disclosed in U.S. Pat. Nos. 4,377,631; 4,529,682; and 4,587,196, all which issued to Medhat Toukhy.

Other photoactive compounds may also be added to the radiation sensitive mixtures of the present invention. These other photoactive compounds may include o-quinonediazide esters derived from polyhydric phenols, alkyl-polyhydroxyphenones, aryl-polyhydroxyphenones, and the like which can contain up to six or more sites for esterification. The most preferred o-quinonediazide esters are derived from 3-diazo-3,4-dihydro-4-oxonaphthalene-1-sulfonic acid chloride and 6-diazo-5,6-dihydro-5-oxo-naphthalene-1-sulfonic acid chloride. When other photoactive compounds are used in radiation sensitive mixtures besides the photoactive compounds of the present invention, the amount of photoactive compounds of the present invention should be at least about 5% by weight, preferably 10–100% by weight of the total photoactive compounds present.

The proportion of the photoactive compound in the radiation sensitive mixture may preferably range from about 5 to about 40%, more preferably from about 7 to about 25% by weight of the non-volatile (e.g. non-solvent) content of the radiation sensitive mixture. The proportion of total binder resin of this present invention in the radiation sensitive mixture may preferably range from about 60 to about 95%, more preferably, from about 75 to 90% of the non-volatile (e.g. excluding solvents) solids content of the radiation sensitive mixture.

These radiation sensitive mixtures may also contain conventional photoresist composition ingredients such as solvents, actinic and contrast dyes, anti-striation agents, plasticizers, speed enhancers, and the like. These additional ingredients may be added to the binder resin and photoactive compound before the solution is coated onto the substrate.

The resins and sensitizers may be dissolved in a solvent or solvents to facilitate their application to the substrate. Examples of suitable solvents include methoxyacetoxy propane, ethyl cellosolve acetate, n-butyl acetate, ethyl lactate, ethyl 3-ethoxy propionate, propylene glycol alkyl ether acetates, or mixtures thereof and the like. Cosolvents such as xylene or n-butylacetate may also be used. The preferred amount of solvent may be from about 50% to about 500%, or higher, by weight, more preferably, from about 100% to about 400% by weight, based on combined resin and sensitizer weight.

Actinic dyes help provide increased resolution on highly reflective surfaces by inhibiting back scattering of light off the substrate. This back scattering causes the undesirable effect of optical notching, especially on a highly reflective substrate topography. Examples of actinic dyes include those that absorb light energy at approximately 400–460 nm [e.g. Fat Brown B (C.I. No. 12010); Fat Brown RR (C I. No. 11285); 2-hydroxy-1,4-naphthoquinone (C.I. No. 75480) and Quinoline Yellow A (C.I. No. 47000)] and those that absorb light energy at approximately 300–340 nm [e.g. 2,5-diphenyloxazole (PPO-Chem. Abs. Reg. No. 92-71-7) and 2-(4-biphenyl)-6-phenylbenzoxazole (PBBO-Chem. Abs. Reg. No. 17064-47-0)]. The amount of actinic dyes may be up to ten percent weight levels, based on the combined weight of resin and sensitizer.

Contrast dyes enhance the visibility of the developed images and facilitate pattern alignment during manufacturing. Examples of contrast dye additives that may be used together with the radiation sensitive mixtures of the present invention include Solvent Red 24 (C.I. No. 26105), Basic Fuchsin (C.I. 42514), Oil Blue N (C.I. No. 61555) and Calco Red A (C.I. No. 26125) up to 10% weight levels, based on the combined weight of resin and sensitizer.

Anti-striation agents level out the photoresist coating or film to a uniform thickness. Anti-striation agents may be used up to five percent weight levels, based on the combined weight of resin and sensitizer. One suitable class of anti-striation agents is nonionic silicon-modified polymers. Nonionic surfactants may also be used for this purpose, including, for example, nonylphenoxy poly(ethyleneoxy) ethanol; octylphenoxy (ethyleneoxy) ethanol; and dinonyl phenoxy poly(ethyleneoxy) ethanol.

Plasticizers improve the coating and adhesion properties of the photoresist composition and better allow for the application of a thin coating or film of photoresist which is smooth and of uniform thickness onto the substrate. Plasticizers which may be used include, for example, phosphoric acid tri-(B-chloroethyl)-ester; stearic acid; dicamphor; polypropylene; acetal resins; phenoxy resins; and alkyl resins up to 10% weight levels, based on the combined weight of resin and sensitizer.

Speed enhancers tend to increase the solubility of the photoresist coating in both the exposed and unexposed areas, and thus, they are used in applications where speed of development is the overriding consideration even though some degree of contrast may be sacrificed, i e., in positive resists while the exposed areas of the photoresist coating will be dissolved more quickly by the developer, the speed enhancers may also cause a larger loss of photoresist coating from the unexposed areas. Speed enhancers that may be used include, for example, picric acid, nicotinic acid or nitrocinnamic acid at weight levels of up to 20%, based on the combined weight of resin and sensitizer.

The prepared radiation sensitive resist mixture, can be applied to a substrate by any conventional method used in the photoresist art, including dipping, spraying, whirling and spin coating. When spin coating, for example, the resist mixture can be adjusted as to the percentage of solids content in order to provide a coating of the desired thickness given the type of spinning equipment and spin speed utilized and the amount of time allowed for the spinning process. Suitable substrates include silicon, aluminum or polymeric resins, silicon dioxide, doped silicon dioxide, silicon resins, gallium arsenide, silicon nitride, tantalum, copper, polysilicon, ceramics and aluminum/copper mixtures. The coating surfaces of these substrates may or may not be primed with a conventional adhesion promoter (e.g. hexamethyldisilazane) before the photoresist coating is applied.

The photoresist coatings produced by the above described procedure are particularly suitable for application to silicon wafers coated with a silicon dioxide or silicon nitride layer such as are utilized in the production of microprocessors and other miniaturized integrated circuit components. An aluminum or aluminum-coated substrates may be used as well. The substrate may also comprise various polymeric resins especially transparent polymers such as polyesters and polyolefins.

After the resist solution is coated onto the substrate, the coated substrate is baked at approximately 70° C. to 125° C. until substantially all the solvent has evaporated and only a uniform radiation sensitive coating remains on the substrate.

The coated substrate can then be exposed to radiation, especially ultraviolet radiation, in any desired exposure pattern, produced by use of suitable masks, negatives, stencils, templates, and the like. Conventional imaging process or apparatus currently used in processing photoresist-coated substrates may be employed with the present invention. While ultraviolet (UV) light is the preferred source of radiation, other sources of radiation such as visible light, electron or ion beam and X-ray radiant energy may be instead used.

The exposed resist-coated substrates are preferably subjected to a post exposure bake at a temperature from about 90° C. to about 120° C. from about 30–300 seconds to enhance image quality and resolution.

The exposed resist-coated substrates are next developed in an aqueous alkaline developing solution. This solution is preferably agitated, for example, by nitrogen gas agitation. Examples of aqueous alkaline developers include aqueous solutions of tetramethylammonium hydroxide, sodium hydroxide, potassium hydroxide, ethanolamine, choline, sodium phosphates, sodium carbonate, sodium metasilicate, and the like. The preferred developers for this invention are aqueous solutions of either alkali metal hydroxides, phosphates or silicates, or mixtures thereof, or tetramethylammonium hydroxide.

Alternative development techniques such as spray development or puddle development, or combinations thereof, may also be used.

The substrates are allowed to remain in the developer until all of the resist coating has dissolved from the exposed areas. Normally, development times from about 10 seconds to about 3 minutes are employed.

After selective dissolution of the coated wafers in the developing solution, they are preferably subjected to a deionized water rinse to fully remove the developer or any remaining undesired portions of the coating and to stop further development. This rinsing operation (which is part of the development process) may be followed by blow drying with filtered air to remove excess water. A post-development heat treatment or bake may then be employed to increase the coating's adhesion and chemical resistance to etching solutions and other substances. The post-development heat treatment can comprise the baking of the coating and substrate below the coating's thermal deformation temperature.

In industrial applications, particularly in the manufacture of microcircuitry units on silicon/silicon dioxide-type substrates, the developed substrates may then be treated with a buffered hydrofluoric acid etching solution or plasma gas etch. The resist compositions of the present invention are believed to be resistant to a wide variety of acid etching solutions or plasma gases and provide effective protection for the resist-coated areas of the substrate.

Later, the remaining areas of the photoresist coating may be removed from the etched substrate surface by conventional photoresist stripping operations. The present invention is further described in detail by means of the following Examples. All parts and percentages are by weight unless explicitly stated otherwise.

EXAMPLE 1

SYNTHESIS OF SYNTHESIS OF
1.2-NAPHTHOQUINONEDIAZIDE-4-SULFONIC
ACID TETRAESTER OF
2,2,6,6-TETRAMETHYLOL CYCLOHEXANOL

A. Step 1: Synthesis of Tetramethylol Cyclohexanol

A 2-liter, 3-neck flask was charged with 93 grams of cyclohexanone (1 mole), 900 mls. of water, and 166 grams paraformaldehyde (5.5 moles). The reaction mixture was cooled to 15° C. and 35 grams of calcium oxide were added in portions over a 10-minute period. The temperature was maintained at 40°–45° C. by occasional cooling until the exotherm subsided. The solution was then stirred for an additional hour. The calcium oxide was then neutralized with formic acid to a stable pH of 6–6.5.

The reaction mixture was concentrated under reduced pressure to a thick syrup. The product was slurried in 500 mls. of methanol at 50° C. for 15 minutes, cooled, then filtered.

The crude product was slurried twice in 150 mls. of acetone, filtered, and then vacuum-dried.

Yield was 120 grams (55% of theory). The melting point was 127° C. (theory is 128°–129° C.).

B. Step 2: Synthesis of
1.2-Naphthoquinonediazide-4-Sulfonic Acid Ester of
2.2.6.6-Tetramethylol Cyclohexanol A 250 cc, 3-neck flask is charged with 5.5 grams of 2,2,6,6-tetramethylol cyclohexanol (0.025 moles), made in step 1, 67 grams of 1,2-naphthoquinonediazide-4-sulfonyl chloride (0.25 moles), and 125 mls. pyridine. The solution was stirred for 24 hours at room temperature. The reaction mixture was then drowned in 1,200 mls. of water acidified with 120 mls. of 37% HCl acid, filtered, and then water-washed. The crude product was then redissolved in 500 mls. acetone, followed by 5 grams of carbon black were added. The mixture was stirred for 30 minutes, then filtered. The filtrate was drowned in 2 liters of methanol. The solids were separated and vacuum-dried.

Yield was 17 grams (49% of theory). Purity was 92% by high pressure liquid chromatography.

EXAMPLE 2

SYNTHESIS OF
1.2-NAPHTHOQUINONEDIAZIDE-4-SULFONIC
ACID TETRAESTER OF
4-METHYL-2,2,6,6-TETRAMETHYLOL
CYCLOHEXANOL

A. Step 1: Synthesis of 4-Methyl-2,2,6,6-Tetramethylol Cyclohexanol

A 2-liter, 3-neck flask equipped with a stirrer, a thermometer, heating mantle, and a condenser was charged with 122 grams (1 mole) of 4-methyl cyclohexanone, 116 grams of paraformaldehyde (5.5 moles), and 900 ml deionized water at room temperature. With fast stirring, 35 grams of calcium oxide (0.624 moles) was added. Temperature at the end of the addition was 25° C.; after stirring for 10 minutes temperature rose to 40° C. and after 15 minutes, the temperature continued to rise reaching 57° C. The solution was then cooled to maintain the temperature at 50° C. until the exotherm subsided. The solution was then stirred at 50°-55° C. for an additional hour. At the end, a tarry substance separated.

11.3 grams of 90% by weight formic acid was added to the reaction mixture, and the mixture was stirred for 30 minutes. At the end, the tar coagulated to a tan precipitate.

The reaction mixture was stripped under vacuum to a syrup. Then 500 cc of absolute methanol was added. The mixture was heated to 50° C. and stirred for 15 minutes, then filtered, and washed with acetone.

The filtrate was stripped under vacuum, and the above process was repeated to give a total yield of 105 grams or 44% of theory.

B. Step 2: Synthesis of 1.2-Naphthoquinonediazide-4-Sulphonic Acid Tetraester of 4-Methyl-2,2,6,6-Tetramethylol Cyclohexanol)

A 250, 3-neck flask was charged with 5.85 grams of 2,2,6,6-(4-methyl) tetra methylol cyclohexanol (0.25 moles) made by step 1, 67 grams of 1,2-naphthoquinone diazide-4-sulfonyl chloride (0.25 moles), and 125 ml of pyridine. The mixture was stirred for 24 hours at room temperature, then drowned in 2 liters of water containing 120 ml of 37% HCl, diluted with 120 ml of water.

The product was filtered and washed with water. The crude product was purified by dissolving in 500 cc acetone, filtered, and then drowned in one liter of methanol. The product was then isolated by filtration and dried.

The yield was 15 grams. 51% of theory. 92% purity.

The following resist formulations were made with the radiation-sensitive compound of Example 1.

RESIST FORMULATIONS

Example R1

2.6 gms. of the radiation-sensitive compound of Example 1 was dissolved in 30.24 gms. of an ethyl lactate (EL) solution containing 25.8% novolak content. The novolak was a cresol/formaldehyde novolak prepared from a mixture of 60% para-cresol and 40% meta-cresol which was acid catalyzed. This mixture was further diluted with 7.13 gms. of ethyl-3-ethoxypropionate (EEP) solvent and 0.03 gm. of an alkyl resin/silicone surfactant leveling agent was added. The resist solution was microfiltered through 0.2 micron disc filter before application. The final solids content of this resist was 26% with the radiation-sensitive compound consisting 25% of the total solids by weight. The solvent composition of this resist was 75% by weight EL and 25% by weight EEP.

Example R2

The same intermediates as in R1 were used to formulate this resist at the following weights: 32.25 gms. ethyl lactate solution, 2.05 gms. radiation-sensitive compound, 5.64 gms. (EEP) solvent, 0.03 gm. leveling agent. The final solids content of this resist was 26% with the radiation-sensitive compound consisting 20% of the total solids by weight.

Example R3

This resist was prepared by blending 26.4 gms. of resist R1 with 17.6 gms. of micro filtered ethyl lactate solution. The ethyl lactate solution was the same ethyl lactate solution as used in Examples R1 and R2. The final solids contents of this resist was 25.92% with the radiation-sensitive compound consisting 15% of the total solids by weight.

Example R4

12.0 gms. of the radiation-sensitive compound of Example 1 was dissolved in 205.94 gms. of a mixed ethyl lactate/ethyl-3-ethoxy propionate solution containing 30.65% by weight novolak. The solvent portion of the solution consisted of 76.39% by weight EL and 23.61% by weight EEP. The novolak composition and molecular weight was the same as used in resist Examples R1, R2, and R3. The solution was further diluted to 25% final solids content by adding 82 gms. of EL solvent. A leveling agent (0.09 gm.) was then added. The radiation-sensitive compound was 16% by weight of the total solids of this resist.

Example R5

This resist was formulated by blending 21.202 gms. of resist R4 with 4.893 gms. of microfiltered ethyl lactate solution containing 25% by weight novolak. The ethyl lactate solution used in this example was prepared from an identical composition and molecular weight as that used in examples R1, R2, and R3. The radiation-sensitive compound amounted to 13% by weight of the total solids of this resist formulation.

Example R6

19.31 gms. of R5 resist were further blended with the same ethyl lactate solution as used in Examples R1, R2, and R3. The final radiation-sensitive compound level was 10% by weight of the total solids.

Example R7

This resist was prepared by blending equal weights of resist R4 and the ethyl lactate solution used in Examples R1, R2, R3 and R5. The final radiation-sensitive level of this resist was 8% by weight of the total solids.

RESIST EVALUATION

All resist coatings, R1 to R7, were applied on 4 inch bare silicon wafers. The wafers were previously vapor primed for at least 10 minutes after dehydration with hexamethyldisilazane (HMDS). Resist coatings were prepared using either a GCA wafer track model 1000 or a manual spinner (e.g., Headway spinners). The spin speeds, applied to produce 1.1–1.2 microns of dry resist coatings, ranged between 4,500 and 5,350 rpm for 30 seconds.

The resist formulations of Examples R1, R2, and R3 were coated and soft baked at 115° C. for 50 seconds on the GCA track hot plate. These wafers were then exposed to Patterned UV radiation with the Ulratech 1000 step and repeat exposure unit. The UV radiation wave length of this stepper was 436nm, 405nm, and the band between these two wave lengths. No post exposure bake was applied in the evaluation of these wafers before development. The development cycle employed with these resists was 2.5 second developer dispense, 45 second dwell (puddle), 10 second rinse with deionized water, followed by 10 second spin dry. Two commercial developers produced by Olin Hunt Specialty Products were used in this evaluation. These developers were HPRD-428 and HPRD-407.

Resist formulations of Examples R4, R5, R6, and R7 were coated and soft baked at 90° C. for 90 seconds on a vacuum held wafer hot plate. These wafers were exposed with a Hitachi i-line wafer stepper model LD-50101 equipped with a 0.40 NA lens. The wavelength of the exposure radiation of this tool was 365 nm. The coated wafers were post exposure baked for 60 seconds at 110° C., with the exception of R5, which was post exposure baked for 60 seconds at 120° C. The development cycle of these wafers was: 2.5 second developer dispense, 60 second dwell (puddle), 10 second rinse with deionized water, and 20 second spin dry. The developer used was an aqueous solution of tetramethyl-ammonium hydroxide at 0.26 normality.

EVALUATION CONDITIONS AND RESULTS

The following two tables provide the conditions and results of the evaluation of the resist examples. Table 1 provides data of Examples R-b 1–R3, and Table 2 for Examples R4–R7:

TABLE 1

| Example | % PAC | Developer | Photospeed | Image Quality | Scum |
|---|---|---|---|---|---|
| R1 | 25 | HPRD-407 | 1100mJ/cm² | Rounded top | Severe |
| R2 | 20 | HPRD-428 | 1000mJ/cm² | Rounded top | Slight |
| R3 | 15 | HPRD-428 | 920mJ/cm² | Flat top | None |

% PAC = % Photo Active Compound in total solids by weight.

TABLE 2

| Example | % PAC | Thickness (Microns) | Photospeed | Image Resolution | Image Slope |
|---|---|---|---|---|---|
| R4 | 16 | 1.1744 | 100mJ/cm² | 0.52–0.55* | 83° |
| R5 | 13 | 1.1767 | 110mJ/cm² | 0.50–0.52* | 85° |
| R6 | 10 | 1.1802 | 45mJ/cm² | 0.50–0.52* | 88–90° |
| R7 | 8 | 1.17 | <40mJ/cm² | 0.57–0.60* | — |

% PAC = % Photo Active Compound in total solids by weight.
Image Slope = Side wall angle of resist line patterns.
*Resolution (in microns) = Linear resolution of equal line/space at optimum exposure energy.

The data in Tables I and II indicate that photoresists containing the sensitizer of the present invention are (1) not suitable for g-line or h-line imaging applications (see Examples R1–R3) and (2) are very suitable for advanced i-line imaging applications (see Examples R4–R7). It is believed that further experimentation may find suitable formulations where the sensitizers of the present invention would be useful in g-line and h-line applications.

While the invention has been described above with reference to specific embodiments thereof, it is apparent that many changes, modifications, and variations can be made without departing from the inventive concept disclosed herein. Accordingly, it is intended to embrace all such changes, modifications, and variations that fall within the spirit and broad scope of the appended claims. All patent applications, patents, and other publications cited herein are incorporated by reference in their entirety.

What is claimed:

1. A photoactive compound having formula (I):

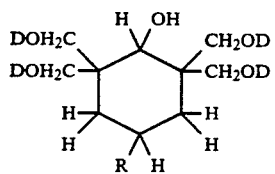

wherein R is selected from the group consisting of hydrogen or a lower alkyl group having 1–4 carbon atoms and each D is individually selected from the group of hydrogen or photoactive o-napthoquinonediazide sulfonyl group; subject to the proviso that at least two of the four D's in formula (I) are photoactive o-naphthoquinonediazide sulfonyl moieties.

2. The photoactive compound of claim 1, wherein said compound has the formula (IA):

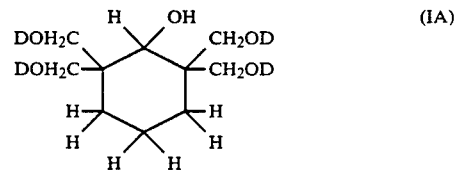

3. The photoactive compound of claim 1, wherein said compound has the formula (IB):

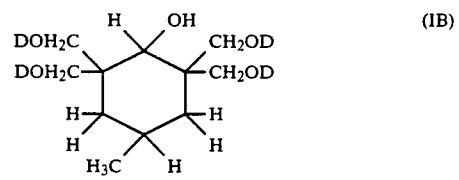

4. The photoactive compound of claim 1, wherein said D is 3-diazo-3,4-dihydro-4-oxo-naphthalene-1-sulfonyl or hydrogen with the proviso that at least three of said D's in each formula are of said sulfonyl moieties.

5. A radiation-sensitive composition comprising at least one alkali-soluble binder resin and at least one photoactive compound of formula (I):

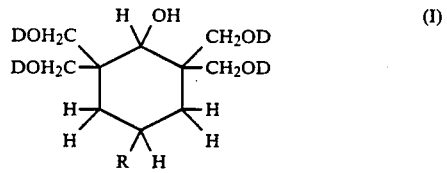

wherein R is selected from the group consisting of hydrogen or a lower alkyl group having 1–4 carbon atoms; and each D is individually selected from the group consisting of hydrogen and an o-naphthoquinone diazide sulfonyl group, subject to the proviso that at least two D's are o-naphthoquinone diazide sulfonyl groups; and wherein the amount of said binder resin being about 60% to 95% by weight and the amount of photoactive compound being from about 5% to about 40% by weight, based on the total solids content of said radiation-sensitive mixture.

6. The radiation sensitive mixture of claim 5, wherein said photoactive compound is present in the amount of about 10% to about 25% by weight, based on the total solid content of said light sensitive composition and said binder resin is present in the amount of about 75% to about 90% by weight, based on the total solids content of said radiation-sensitive composition.

7. The radiation sensitive mixture of claim 5, wherein said photoactive compound comprises a compound of the formula (IA):

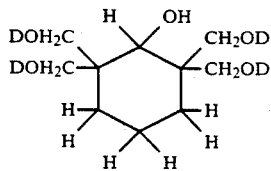

(IA)

8. The radiation sensitive mixture of claim 5, wherein said photoactive compound comprises a compound of the formula (IB):

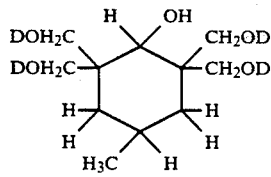

(IB)

9. The radiation sensitive mixture of claim 5, wherein said D is 3-diazo-3,4-dihydro-4-oxo-naphthalene-1-sulfonyl or hydrogen with the proviso that at least three of said D's are of said sulfonyl moieties.

10. The radiation sensitive mixtures of claim 5, further comprising at least one substance selected from solvents, actinic and visual contrast dyes, plasticizers, anti-striation agents, and speed enhancers.

11. A coated substrate comprising a substrate coated with a film of a radiation sensitive mixture comprising an admixture of at least one alkali-soluble binder resin compound and at least one photoactive compound of formula (I):

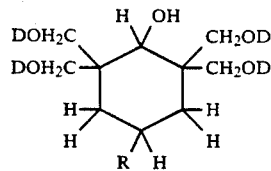

(I)

wherein R is selected from the group consisting of hydrogen and a lower alkyl group having 1-4 carbon atoms; and each D is individually selected from the group consisting of an o-naphthoquinone diazide sulfonyl group and hydrogen; with the proviso that at least two D's in each formula are o-naphthoquinone diazide sulfonyl groups; and wherein the amount of said binder resin being about 60% to 95% by weight and the amount of photoactive compound being from about 5% to about 40% by weight, based on the total solid content of said light sensitive mixture.

12. The coated substrate of claim 11, wherein said substrate comprises one or more compounds selected from the group consisting of polyester, polyolefin, silicon, gallium arsenide, silicon/silicon dioxide, doped silicon dioxide, silicon nitride, aluminum/copper mixtures, tantalum, copper, and polysilicon.

13. The coated substrate of claim 11, wherein said substrate is a silicon wafer coated with silicon dioxide.

* * * * *